US007396632B2

(12) United States Patent
Wolk et al.

(10) Patent No.: US 7,396,632 B2
(45) Date of Patent: *Jul. 8, 2008

(54) THERMAL MASS TRANSFER SUBSTRATE FILMS, DONOR ELEMENTS, AND METHODS OF MAKING AND USING SAME

(75) Inventors: Martin B. Wolk, Woodbury, MN (US); Thomas R. Hoffend, Jr., Woodbury, MN (US); Stephen A. Johnson, Woodbury, MN (US); John P. Baetzold, North St. Paul, MN (US); Richard J. Thompson, Lino Lakes, MN (US); Terence D. Neavin, St. Paul, MN (US); Michael A. Haase, St. Paul, MN (US); Sergey A. Lamansky, Apple Valley, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/737,345

(22) Filed: Apr. 19, 2007

(65) Prior Publication Data

US 2007/0281241 A1 Dec. 6, 2007

Related U.S. Application Data

(63) Continuation of application No. 11/420,894, filed on May 30, 2006, now Pat. No. 7,223,515.

(51) Int. Cl.
*G03F 7/36* (2006.01)
*B05D 5/06* (2006.01)

(52) U.S. Cl. .................... 430/200; 430/201; 430/271.1; 430/964; 427/162; 428/409; 428/913

(58) Field of Classification Search ................. 430/200, 430/201, 271.1, 964; 427/162; 428/409, 428/913
See application file for complete search history.

(56) References Cited

U.S. PATENT DOCUMENTS 4,623,896 A 11/1986 Hausslein (Continued)

FOREIGN PATENT DOCUMENTS

EP 321923 A2 6/1989

(Continued)

OTHER PUBLICATIONS

Irie et al., "Thermal transfer . . . ",Journal of Imaging Science and Techn., May/Jun. 1993; 37(3); p. 235-238.*

(Continued)

*Primary Examiner*—Richard L. Schilling
(74) *Attorney, Agent, or Firm*—Lance Vietzke

(57) ABSTRACT

Substrate films, thermal mass transfer donor elements, and methods of making and using the same are provided. In some embodiments, such substrate films and donor elements include at least two dyads, wherein each dyad includes an absorbing first layer and an essentially non-absorbing second layer. Also provided are methods of making a donor element that includes an essentially non-absorbing substrate, an absorbing first layer, and a non-absorbing second layer, wherein the composition of the essentially non-absorbing substrate is essentially the same as the composition of the essentially non-absorbing second layer.

20 Claims, 5 Drawing Sheets

U.S. PATENT DOCUMENTS

| | | | |
|---|---|---|---|
| 4,772,582 | A | 9/1988 | DeBoer |
| 4,833,124 | A | 5/1989 | Lum |
| 4,912,083 | A | 3/1990 | Chapman et al. |
| 4,942,141 | A | 7/1990 | DeBoer et al. |
| 4,948,776 | A | 8/1990 | Evans et al. |
| 4,948,778 | A | 8/1990 | DeBoer |
| 4,950,639 | A | 8/1990 | DeBoer et al. |
| 4,950,640 | A | 8/1990 | Evans et al. |
| 4,952,552 | A | 8/1990 | Chapman et al. |
| 5,023,229 | A | 6/1991 | Evans et al. |
| 5,024,990 | A | 6/1991 | Chapman et al. |
| 5,156,938 | A | 10/1992 | Foley et al. |
| 5,286,604 | A | 2/1994 | Simmons, III |
| 5,340,699 | A | 8/1994 | Haley et al. |
| 5,351,617 | A | 10/1994 | Williams et al. |
| 5,360,694 | A | 11/1994 | Thien et al. |
| 5,401,607 | A | 3/1995 | Takiff et al. |
| 5,440,446 | A | 8/1995 | Shaw et al. |
| 5,455,217 | A | 10/1995 | Chang et al. |
| 5,501,937 | A | 3/1996 | Matsumoto et al. |
| 5,506,189 | A | 4/1996 | Chou et al. |
| 5,512,931 | A | 4/1996 | Nakajima et al. |
| 5,580,693 | A | 12/1996 | Nakajima et al. |
| 5,725,909 | A * | 3/1998 | Shaw et al. .............. 427/412.1 |
| 5,725,989 | A | 3/1998 | Chang et al. |
| 5,882,774 | A | 3/1999 | Jonza et al. |
| 6,045,737 | A | 4/2000 | Harvey et al. |
| 6,228,555 | B1 | 5/2001 | Hoffend, Jr. et al. |
| 6,231,939 | B1 | 5/2001 | Shaw et al. |
| 6,284,425 | B1 | 9/2001 | Staral et al. |
| 6,352,761 | B1 | 3/2002 | Hebrink et al. |
| 6,368,699 | B1 | 4/2002 | Gilbert et al. |
| 6,461,793 | B2 | 10/2002 | Chang et al. |
| 6,468,715 | B2 | 10/2002 | Hoffend, Jr. et al. |
| 6,476,842 | B1 | 11/2002 | Chang |
| 6,569,515 | B2 | 5/2003 | Hebrink et al. |
| 6,582,876 | B2 | 6/2003 | Wolk et al. |
| 6,586,153 | B2 | 7/2003 | Wolk et al. |
| 6,673,425 | B1 | 1/2004 | Hebrink et al. |
| 6,689,538 | B2 | 2/2004 | Hoffend, Jr. et al. |
| 6,783,349 | B2 * | 8/2004 | Neavin et al. ............ 425/133.5 |
| 6,866,979 | B2 | 3/2005 | Chang et al. |
| 6,946,188 | B2 | 9/2005 | Hebrink et al. |
| 7,014,978 | B2 | 3/2006 | Bellman et al. |
| 7,223,515 | B1 * | 5/2007 | Wolk et al. .................. 430/200 |
| 2004/0214031 | A1 | 10/2004 | Wilmberger-Friedl et al. |
| 2005/0118362 | A1 | 6/2005 | Kim et al. |
| 2005/0287315 | A1 | 12/2005 | Krellich et al. |

FOREIGN PATENT DOCUMENTS

| | | | |
|---|---|---|---|
| EP | 321923 | A3 | 6/1989 |
| EP | 321923 | B1 | 7/1992 |
| EP | 568993 | A2 | 11/1993 |
| EP | 568993 | A3 | 11/1993 |
| EP | 568993 | B1 | 8/1998 |

OTHER PUBLICATIONS

Abramowitz and Stegun, Eds., *Handbook of Mathematical Functions*, Dover New York (1972).

Bello et al., *J. Chem. Soc., Chem. Com.*, 1993, 452-454.

Brackmann, *Lambdachrome Laser Dyes*, Lambda Physik GmbH, Goettingen (1997).

Carlslaw and Jaegar, *Conduction of Heat in Solids*, Oxford University Press, Oxford (1959).

Herbst et al.,*Industrial Organic Pigments: Production, Properties, Applications*, VCH Publishers, Inc., New York (1993).

Hunger, *Industrial Dyes: Chemistry, Properties, Applications*, Wiley-VCH Verlag GmbH & Co., KGaA Weinheim (2003).

Matsuoka, *Absorption Spectra of Dyes for Diode Lasers*, Bunshin Publishing Co., Tokyo (1990).

Matsuoka, *Infrared Absorbing Materials*, Plenum Press, New York (1990).

NPIRI Raw Materials Data Handbook, vol. 4, Pigments, 1983.

*Product data sheet*: "EPOLIN Infrared and Laser Absorbing Dyes" datasheet [online]. EPOLIN, Inc., Newark, NJ, Sep. 2005 [retrieved on Jun. 8, 2006], Retrieved from the Internet:<URL:http://www.epolin.com/>; 1 pg.

*Product data sheet*: "H.W. Sands Corp. Specially Chemicals for the World Wide Imaging Industry" datasheet [online]. H.W. Sands Corp., Jupiter, FL, Jun. 2, 2006 [retrieved on Jun. 8, 2006]. Retrieved from the Internet:<URL:http://www.hwsands.com/>; 1 pg.

Resnick et al., "Imprint lithography for integrated circuit fabrication,"*J. Vac. Sci. Technol. B*, Nov./Dec. 2003; 21(6):2624-2631.

* cited by examiner

THERMAL MASS TRANSFER SUBSTRATE FILMS, DONOR ELEMENTS, AND METHODS OF MAKING AND USING SAME

CROSS REFERENCE TO RELATED APPLICATIONS

This application is a continuation of U.S. Ser. No. 11/420,894, filed May 30, 2006 now U.S. Pat. No. 7,223,515, now allowed, the disclosure of which is incorporated by reference in its entirety herein.

BACKGROUND

The thermal transfer of layers from a thermal transfer element to a receptor has been suggested for the preparation of a variety of products including, for example, color filters, polarizers, printed circuit boards, liquid crystal display devices, and electroluminescent display devices. For many of these products, resolution and edge sharpness are important factors in the manufacture of the product. Another factor is the size of the transferred portion of the thermal transfer element for a given amount of thermal energy. As an example, when lines or other shapes are transferred, the linewidth or diameter of the shape depends on the size of the resistive element or light beam used to pattern the thermal transfer element. The linewidth or diameter also depends on the ability of the thermal transfer element to transfer energy. Near the edges of the resistive element or light beam, the energy provided to the thermal transfer element may be reduced. Thermal transfer elements with better thermal conduction, less thermal loss, more sensitive transfer coatings, and/or better light-to-heat conversion typically produce larger linewidths or diameters. Thus, the linewidth or diameter can be a reflection of the efficiency of the thermal transfer element in performing the thermal transfer function.

One manner in which thermal transfer properties can be improved is by improvements in the formulation of the transfer layer material. For example, including a plasticizer in the transfer layer can improve transfer properties. Other ways to improve transfer fidelity during laser induced thermal transfer include increasing the laser power and/or fluence incident on the donor media. However, increasing laser power or fluence can lead to imaging defects, presumably caused in part by overheating of one or more layers in the donor media.

SUMMARY

In one aspect, the present invention provides a substrate film for a thermal transfer donor element. In certain embodiments, the substrate film includes a stack of layers including at least two dyads, wherein each dyad includes: an absorbing first layer; and an essentially non-absorbing second layer, wherein each absorbing first layer of the at least two dyads has essentially the same optical absorption rate.

In another aspect, the present invention provides a thermal transfer donor element. In certain embodiments, the thermal transfer donor element includes: an essentially non-absorbing substrate; and a light-to-heat conversion (LTHC) layer on at least a portion of the substrate. The light-to-heat conversion layer includes at least a first stack of layers including at least two dyads, wherein each of the at least two dyads of the first stack of layers includes: an absorbing first layer; and an essentially non-absorbing second layer, wherein each absorbing first layer of the at least two dyads has essentially the same optical absorption rate. In some embodiments, the thermal transfer donor element further includes an underlayer disposed between the substrate and the light-to-heat conversion layer. In some embodiments, the thermal transfer donor element further includes an interlayer on at least a portion of the light-to-heat conversion layer. In some embodiments, the thermal transfer donor element further includes a thermal transfer layer on at least a portion of the light-to-heat conversion layer or the interlayer.

In another aspect, the present invention provides a method of preparing a substrate film for a thermal transfer donor element. The method includes: forming a stack of layers including at least two dyads, wherein each dyad includes: an absorbing first layer; and an essentially non-absorbing second layer, wherein each absorbing first layer of the at least two dyads has essentially the same optical absorption rate.

In another aspect, the present invention provides methods of preparing thermal transfer donor elements, and methods for selective thermal mass transfer using such donor elements. In certain embodiments, the method includes: providing an essentially non-absorbing substrate; and forming a stack of layers including at least two dyads on at least a portion of the substrate, wherein each of the at least two dyads includes: an absorbing first layer; and an essentially non-absorbing second layer, wherein each absorbing first layer of the at least two dyads has essentially the same optical absorption rate.

In certain other embodiments, the present invention provides methods of preparing thermal transfer donor elements including: providing an essentially non-absorbing substrate; forming an absorbing first layer on at least a portion of the substrate; and forming an essentially non-absorbing second layer on at least a portion of the absorbing first layer, wherein the composition of the essentially non-absorbing substrate is essentially the same as the composition of the essentially non-absorbing second layer. The methods optionally further include forming a thermal transfer layer.

Definitions

The terms "comprises" and variations thereof do not have a limiting meaning where these terms appear in the description and claims.

As used herein, "a," "an," "the," "at least one," and "one or more" are used interchangeably.

Also herein, the recitations of numerical ranges by endpoints include all numbers subsumed within that range (e.g., 1 to 5 includes 1, 1.5, 2, 2.75, 3, 3.80, 4, 5, etc.).

Figure 1:
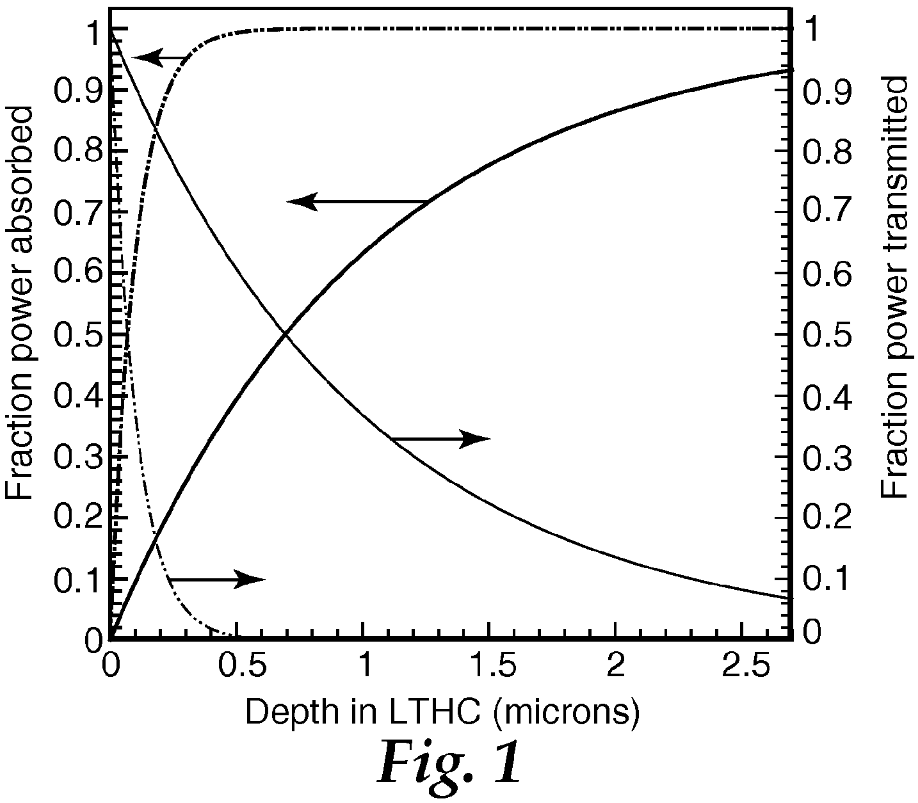
FIG. 1 is a plot comparing the fraction of power absorbed and transmitted versus depth in a LTHC layer for a standard uniform LTHC layer (solid lines) and a single layer of Germanium (broken lines) having the same thickness (2.7 micrometers).

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF ILLUSTRATIVE EMBODIMENTS

One goal in the design of thermal transfer donor elements for use in laser-induced thermal imaging (LITI) is to adjust the donor element to be as sensitive as possible, while simultaneously ensuring that image quality is as high as possible. Preferably, the donor element remains intact and suffers no unintended thermally induced artifacts. In certain embodiments, the edge and top surfaces of the transferred material are preferably as smooth as possible. In the case of inefficient energy management during the imaging process, the transferred material can suffer from defects including darkened regions, instead of desired smooth, continuous lines of transferred material (e.g., lines of color for a liquid crystal display (LCD) color filter). Typical embodiments for LTHC layers include embodiments in which the LTHC layer includes a single layer of a binder (e.g., a polymer or a composite such as an organic polymer-silica nanocomposite) uniformly loaded with material that absorbs light (e.g., carbon black), which is typically solution-coated (i.e., a wet-coated process using, for example, a liquid coating solution, dispersion, or suspension); and/or an embodiment in which the LTHC layer includes a graded metal/metal-oxide composite (thin film), which is typically vapor deposited (e.g., vacuum evaporated or sputtered).

The probability of a thermally induced artifact occurring appears to be dependent on the temperature profile achieved in the LTHC layer. The temperature profile is determined by the generation and diffusion of heat in the imaging construction, which typically includes the donor element (including a transfer layer) and a receptor substrate. The temperature profile is also dependent on the absorbed power per unit volume in the LTHC layer. Absorption (loss) of light in a uniformly loaded LTHC layer as a function of depth into the LTHC layer can be regarded in terms of an analogy with extraction of light from a light fiber with uniformly (as a function of distance down the fiber) rough core-cladding interface. For a carbon black loaded LTHC layer, the rate of energy absorption at a point in the LTHC layer is believed to be proportional to the loading of carbon black.

As described herein, one can design a graded LTHC layer that absorbs essentially the same amount of energy as a non-graded LTHC layer, but that has uniform power absorbed per unit volume. The maximum power per unit volume (and thus the maximum temperature) for a graded LTHC layer can be significantly less than for a non-graded LTHC layer, resulting in a lowered probability of the occurrence of a thermally induced artifact. However, arbitrary grading of a solution-coated LTHC layer with an absorbing material in the coating can be difficult to achieve in a manufacturing setting. For example, one method for preparing a graded, solution-coated LTHC layer is to successively coat two or more layers that have different loadings of absorbing material (e.g., carbon black) on top one another to form a multilayer LTHC layer. See, for example, U.S. Pat. Nos. 6,228,555, 6,468,715, and 6,689,538 (all to Hoffend Jr. et al.). However, such a method can suffer from the necessity of preparing, storing, and coating a multiplicity of different coating solutions, each having differing loadings of absorbing material. As discussed herein, at least some of the disclosed embodiments address the above-described problems.

Certain embodiments disclosed herein provide multilayer LTHC layers that include stacked dyads and/or stacked bands of stacked dyads. As used herein, "dyad" and "bilayer" are used interchangeably and refer to two layers stacked one upon the other, with the total thickness of the dyad being the combined thickness of the two layers forming the dyad. In the certain disclosed embodiments, one or more dyads include an absorbing layer and an essentially non-absorbing layer.

Stacking dyads that each include an absorbing layer and an essentially non-absorbing layer allow one to form a variety of multilayer, graded LTHC layers using a single absorbing layer composition. For example, when the absorbing layer includes a binder uniformly loaded with material that absorbs laser light, the composition of the absorbing layer refers, for example, to the composition of the binder, the composition of the absorbing material, and the loading level of the absorbing material in the binder. Thus, the use of a single absorbing layer composition can address some of the problems encountered in preparing graded multilayer LTHC layers described herein above.

As disclosed herein, a variety of multilayer, graded LTHC layers can be formed using a single absorbing layer composition, for example, by varying the thickness of the absorbing layer and/or by varying the thickness of the essentially non-absorbing layer of each dyad in the stack of dyads. For example, the thickness of the absorbing layer and the essentially non-absorbing layer can each be varied in each dyad, while keeping the thickness of each dyad in the stack of dyads essentially the same. For another example, the thickness of the absorbing layer in each dyad can be varied while the thickness of each essentially non-absorbing layer in each dyad can remain essentially the same, resulting in each dyad having a different thickness. For another example, the thickness of the absorbing layer in each dyad can remain essentially the same while the thickness of each essentially non-absorbing layer in each dyad can vary, resulting in each dyad having a different thickness. For still another example, the thickness of the absorbing layer and the essentially non-absorbing layer can both be varied in each dyad, while resulting in each dyad having a different thickness. Such multilayer, graded LTHC layers can preferably provide one or more characteristics including, for example, constant power absorbed and constant total energy density per dyad; constant fraction absorbing material per dyad and constant dyad thickness; constant power absorbed and fraction absorbing material per dyad; and/or multiple bands of dyads having one or more of these characteristics as further described herein.

Absorbing layers generally refer to layers that include materials that absorb light, particularly laser light of a wavelength useful for laser-induced thermal imaging. In some embodiments, an absorbing layer includes both absorbing material and essentially non-absorbing material, while in other embodiments, the absorbing layer includes only absorbing material. For example, absorbing materials (e.g., dyes and/or pigments such as carbon black and/or other light absorbing particles) can be dissolved, dispersed, or suspended in a binder (e.g., a polymer or a composite). For another example, an absorbing layer can include an absorbing material (e.g., a metal and/or metal oxide such as germanium, lanthanum hexaboride, indium-tin oxide, aluminum oxide, aluminum (sub)oxide, silver oxide, and combinations thereof) without a binder. Absorbing materials typically have an absorption rate of at least 0.25 micrometer$^{-1}$, more preferably at least 1 micrometer$^{-1}$, and most preferably at least 10 micrometers$^{-1}$. Typical absorbing materials that include a binder with a black body absorber (e.g., carbon black) have absorption rates of up to 2 micrometers$^{-1}$. Other absorbing materials that include a binder with dyes, pigments, and/or light absorbing materials therein can have absorption rates of up to 3 micrometers$^{-1}$, 4 micrometers$^{-1}$, or even higher. Typical metal, metal oxide, and/or semiconducting materials can have absorption rates that are substantially higher. For example, at exemplary imaging radiation wavelengths, Germanium has an absorption rate of 10 micrometers$^{-1}$.

Exemplary absorbing materials have been described, for example, in U.S. Pat. No. 6,582,876 (Wolk et al.) and U.S. Pat. No. 6,586,153 (Wolk et al.); Matsuoka, *Infrared Absorbing Materials*, Plenum Press, New York (1990); Matsuoka, *Absorption Spectra of Dyes for Diode Lasers*, Bunshin Publishing Co., Tokyo (1990); Brackmann, *Lambdachrome Laser Dyes*, Lambda Physik GmbH, Goettingen (1997); Herbst et al., *Industrial Organic Pigments: Production, Properties, Applications*, VCH Publishers, Inc., New York (1993); Hunger, *Industrial Dyes: Chemistry, Properties, Applications*, Wiley-VCH Verlag GmbH & Co. KGaA, Weinheim (2003); and those available from, for example, Epolin (Newark, N.J.) and/or H.W. Sands Corp. (Jupiter, Fla.).

Dyes suitable for use as radiation absorbers in an LTHC layer may be present in particulate form, dissolved in a binder material, or at least partially dispersed in a binder material. When dispersed particulate radiation absorbers are used, the particle size can be, at least in some instances, 10 micrometers or less, and may be 1 micrometer or less. Suitable dyes include those dyes that absorb in the IR region of the spectrum. Examples of such dyes may be found in Matsuoka, *Infrared Absorbing Materials*, Plenum Press, New York (1990); Matsuoka, *Absorption Spectra of Dyes for Diode Lasers*, Bunshin Publishing Co., Tokyo (1990); U.S. Pat. No. 4,772,582 (DeBoer); U.S. Pat. No. 4,833,124 (Lum); U.S. Pat. No. 4,912,083 (Chapman et al.); U.S. Pat. No. 4,942,141 (DeBoer et al.); U.S. Pat. No. 4,948,776 (Evans et al.); U.S. Pat. No. 4,948,778 (DeBoer); U.S. Pat. No. 4,950,639 (DeBoer et al.); U.S. Pat. No. 4,950,640 (Evans et al.); U.S. Pat. No. 4,952,552 (Chapman et al.); U.S. Pat. No. 5,023,229 (Evans et al.); U.S. Pat. No. 5,024,990 (Chapman et al.); U.S. Pat. No. 5,156,938 (Chapman et al.); U.S. Pat. No. 5,286,604 (Simmons, III); U.S. Pat. No. 5,340,699 (Haley et al.); U.S. Pat. No. 5,351,617 (Williams et al.); U.S. Pat. No. 5,360,694 (Thien et al.); and U.S. Pat. No. 5,401,607 (Takiff et al.); European Patent Nos. 321,923 (DeBoer) and 568,993 (Yamaoka et al.); and Beilo, K. A. et al., *J. Chem. Soc., Chem. Com.*, 1993, 452-454 (1993). IR absorbers available under the trade designations CYASORB IR-99, IR-126 and IR-165 from Glendale Protective Technologies, Inc. (Lakeland, Fla.) may also be used. A specific dye may be chosen based on factors such as, solubility in, and compatibility with, a specific binder and/or coating solvent, as well as the wavelength range of absorption.

In contrast to absorbing layers, essentially non-absorbing layers generally refer to layers of essentially non-absorbing material in which absorbing materials have not been added. Essentially non-absorbing materials include, for example, materials that can be used as binders (e.g., polymers or composites) in the absorbing layer. Essentially non-absorbing materials typically have an absorption rate of at most 0.01 micrometer$^{-1}$, more preferably at most 0.001 micrometer$^{-1}$, and most preferably at most 0.0001 micrometer$^{-1}$.

It is recognized and anticipated that some degree of mixing between layers may occur during formation and processing of dyads and stacks of dyads. As such, dyads that include an absorbing layer and an essentially non-absorbing layer are meant to encompass not only dyads having a distinct boundary at the interface between the absorbing layer and the essentially non-absorbing layer, but also dyads in which mixing has occurred at the interface between the absorbing layer and the essentially non-absorbing layer. Similarly, stacks of dyads are meant to encompass not only stacks of dyads having a distinct boundary at the interface between each dyad, but also stacks of dyads in which mixing has occurred at the interface between one or more of the dyads.

In one aspect, the present invention provides a substrate film for a thermal transfer donor element. In certain embodiments, the substrate film includes a stack of layers including at least two dyads, wherein each dyad includes: an absorbing first layer; and an essentially non-absorbing second layer, wherein each absorbing first layer of the at least two dyads has essentially the same optical absorption rate. As used herein, "optical absorption rate" refers to fraction of optical power absorbed per unit thickness. Optical absorption rates that are essentially the same preferably differ by no more than 10%, more preferably by no more than 1%, and most preferably by no more than 0.1%, with the difference being expressed as a percentage of the optical absorption rate of the dyad having the largest optical absorption rate (if they are different). In some embodiments, the at least two dyads form a stack having alternating absorbing layers and essentially non-absorbing layers.

Optionally, the substrate film further includes, in addition to the stacked dyads described herein (i.e., optical stack or optical layers), one or more non-optical layers such as, for example, one or more skin layers or one or more interior non-optical layers, such as, for example, protective boundary layers between packets of optical layers. Non-optical layers can be used to give the substrate film structure or to protect it from harm or damage during or after processing. For some applications, it may be desirable to include sacrificial protective skins, wherein the interfacial adhesion between the skin layer(s) and the optical stack and optional interlayer(s) is controlled so that the skin layer(s) can be stripped from the optical stack and optional interlayer(s) before use. In particular, skin layer(s) that are prepared in an extrusion or coextrusion process can reduce or climate particulate contamination of the critical top surface of the LITI donor (optical stack or optional interlayer(s)) and reduce the cleanliness requirements of the environment in which the donor film is produced.

Materials may be chosen for the non-optical layers that impart or improve properties such as, for example, tear resistance, puncture resistance, toughness, weatherability, and solvent resistance of the substrate film. Typically, one or more of the non-optical layers are placed so that at least a portion of the light to be transmitted, polarized, or reflected by the optical layers also travels through these layers (i.e., these layers are placed in the path of light which travels through or is reflected by the optical layers). The non-optical layers typically do not substantially affect the reflective properties of the substrate films over the wavelength region of interest. Properties of the non-optical layers such as crystallinity and shrinkage characteristics need to be considered along with the properties of the optical layers to give the film of the present invention that does not crack or wrinkle when laminated to severely curved substrates.

The non-optical layers may be of any appropriate material and can be the same as one of the materials used in the optical stack. Of course, it is important that the material chosen not have optical properties deleterious to those of the optical stack. The non-optical layers may be formed from a variety of polymers, such as polyesters, including any of the polymers used in the optical layers. In some embodiments, the material selected for the non-optical layers is similar to or the same as a material selected for the optical layers. The use of coPEN, coPET, or other copolymer material for skin layers can reduce the splittiness (i.e., the breaking apart of a film due to strain-induced crystallinity and alignment of a majority of the polymer molecules in the direction of orientation) of the substrate film. The coPEN of the non-optical layers typically orients very little when stretched under the conditions optionally used to orient the optical layers, and so there is little strain-induced crystallinity.

The skin layers and other optional non-optical layers can be thicker than, thinner than, or the same thickness as the optical layers. The thickness of the skin layers and optional non-optical layers is generally at least four times, typically at least 10 times, and can be at least 100 times, the thickness of at least one of the individual optical layers. The thickness of the non-optical layers can be varied to make a substrate film having a particular thickness.

Additional coatings may also be considered non-optical layers. Other layers include, for example, antistatic coatings or films; flame retardants; UV stabilizers; abrasion resistant or hardcoat materials; optical coatings; anti-fogging materials, and combinations thereof. Additional functional layers or coatings are described, for example, in U.S. Pat. No. 6,352,761 (Hebrink et al.), U.S. Pat. No. 6,368,699 (Gilbert et al.), U.S. Pat. No. 6,569,515 (Hebrink et al.), U.S. Pat. No. 6,673,425 (Hebrink et al.), U.S. Pat. No. 6,783,349 (Neavin et al.), and U.S. Pat. No. 6,946,188 (Hebrink et al.). These functional components may be incorporated into one or more skin layers, or they may be applied as a separate film or coating.

In another aspect, the present invention provides a thermal transfer donor element. In certain embodiments, the thermal transfer donor element includes: an essentially non-absorbing substrate; and a light-to-heat conversion layer on at least a portion of the substrate. The light-to-heat conversion layer includes at least a first stack of layers including at least two dyads, wherein each of the at least two dyads of the first stack of layers includes: an absorbing first layer; and an essentially non-absorbing second layer, wherein each absorbing first layer of the at least two dyads has essentially the same optical absorption rate. In some embodiments, the at least two dyads of the first stack of layers form a stack of layers having alternating absorbing layers and essentially non-absorbing layers.

In some embodiments of the thermal transfer donor element, the total thickness of each dyad in the first stack of layers is essentially the same. As used herein, dyads that have "essentially the same" thickness preferably differ by no more than 10%, more preferably by no more than 1%, and most preferably by no more than 0.1%, with the difference being expressed as a percentage of the thickness of the dyad having the largest thickness (if they are different).

In one embodiment of the thermal transfer donor element, the total thickness of each dyad in the first stack of layers is essentially the same, and the thickness of the first layer and the thickness of the second layer for each dyad are selected such that the total power absorbed for each dyad in the first stack of layers is essentially the same. As used herein, "total power absorbed" refers to the fraction of incident available optical power absorbed by the entire stack of dyads. Thus, the total power absorbed for a dyad is the fraction of incident available optical power absorbed by that dyad. The total power absorbed for dyads that have "essentially the same" total power absorbed preferably differ by no more than 10%, more preferably by no more than 1%, and most preferably by no more than 0.1%, with the difference being expressed as a percentage of the total power absorbed for the dyad having the largest total power absorbed (if they are different).

In another embodiment of the thermal transfer donor element, the total thickness of each dyad in the first stack of layers is essentially the same, and the fraction of absorbing material is essentially the same for each dyad in the first stack of layers. As used herein, "fraction of absorbing material" of a dyad refers to the ratio of the thickness of the absorbing layer in the dyad to the total thickness of the dyad. The fraction of absorbing material for dyads that have "essentially the same" fraction absorbing material preferably differ by no more than 10%, more preferably by no more than 1%, and most preferably by no more than 0.1%, with the difference being expressed as a percentage of the fraction of absorbing material of the dyad having the largest fraction of absorbing material (if they are different).

In another embodiment of the thermal transfer donor element, the fraction of absorbing material is essentially the same for each dyad in the first stack of layers, and the thickness of each dyad in the first stack of layers is selected to provide essentially the same total power absorbed for each dyad in the first stack of layers.

In further embodiments of the thermal transfer donor element, the light-to-heat conversion layer further includes a second stack of layers including at least two dyads, wherein the fraction of absorbing material is essentially the same for each dyad in the second stack of layers, and the fraction of absorbing material is essentially the same for each dyad in the first stack of layers. In some such embodiments, the total thickness of each dyad in the first stack of layers is essentially the same, the total thickness of each dyad in the second stack of layers is essentially the same, and the total thickness of each dyad in the first stack of layers is different than the total thickness of each dyad in the second stack of layers.

Optionally, the thermal transfer donor element further includes an underlayer disposed between the substrate and the light-to-heat conversion layer as described, for example, in U.S. Pat. No. 6,284,425 (Staral et al.). An optional underlayer may be coated or otherwise disposed between a donor substrate and the LTHC layer to minimize damage to the donor substrate during imaging, for example. The underlayer can also influence adhesion of the LTHC layer to the donor substrate element. Typically, the underlayer has high thermal resistance (i.e., a lower thermal conductivity than the substrate) and acts as a thermal insulator to protect the substrate from heat generated in the LTHC layer. Alternatively, an underlayer that has a higher thermal conductivity than the substrate can be used to enhance heat transport from the LTHC layer to the substrate, for example to reduce the occurrence of imaging defects that can be caused by LTHC layer overheating.

Suitable underlayers include, for example, polymer films, metal layers (e.g., vapor deposited metal layers), inorganic layers (e.g., sol-gel deposited layers and vapor deposited layers of inorganic oxides (e.g., silica, titania, aluminum oxide and other metal oxides)), organic/inorganic composite layers, and combinations thereof. Organic materials suitable as underlayer materials include both thermoset and thermoplastic materials. Suitable thermoset materials include resins that may be crosslinked by heat, radiation, and/or chemical treatment including, but not limited to, crosslinked and/or crosslinkable polyacrylates, polymethacrylates, polyesters, epoxies, polyurethanes, and combinations thereof. The thermoset materials may be coated onto the donor substrate or LTHC layer as, for example, thermoplastic precursors and subsequently crosslinked to form a crosslinked underlayer.

Suitable thermoplastic materials include, for example, polyacrylates, polymethacrylates, polystyrenes, polyurethanes, polysulfones, polyesters, polyimides, and combinations thereof. These thermoplastic organic materials may be applied via conventional coating techniques (e.g., solvent coating or spray coating). The underlayer may be either transmissive, absorptive, reflective, or some combination thereof, to one or more wavelengths of imaging radiation.

Inorganic materials suitable as underlayer materials include, for example, metals, metal oxides, metal sulfides, inorganic carbon coatings, and combinations thereof, including those materials that are transmissive, absorptive, or reflective at the imaging light wavelength. These materials may be coated or otherwise applied via conventional techniques (e.g., vacuum sputtering, vacuum evaporation, and/or plasma jet deposition).

The underlayer may provide a number of benefits. For instance, the underlayer may be used to manage or control heat transport between the LTHC layer and the donor substrate. An underlayer may be used to insulate the substrate from heat generated in the LTHC layer or to absorb heat away from the LTHC layer toward the substrate. Temperature management and heat transport in the donor element can be accomplished by adding layers and/or by controlling layer properties such as thermal conductivity (e.g., either or both the value and the directionality of thermal conductivity), distribution and/or orientation of absorber material, or the morphology of layers or particles within layers (e.g., the orientation of crystal growth or grain formation in metallic thin film layers or particles).

The underlayer may contain additives, including, for example, photoinitiators, surfactants, pigments, plasticizers, coating aids, and combinations thereof. The thickness of the underlayer may depend on factors such as, for example, the material of the underlayer, the material and optical properties of the LTHC layer, the material of the donor substrate, the wavelength of the imaging radiation, the duration of exposure of the thermal transfer element to imaging radiation, the overall donor element construction, and combinations thereof. For a polymeric underlayer, the thickness of the underlayer is typically at least 0.05 micrometer, preferably at least 0.1 micrometer, more preferably at least 0.5 micrometer, and most preferably at least 0.8 micrometer. For a polymeric underlayer, the thickness of the underlayer is typically at most 10 micrometers, preferably at most 4 micrometers, more preferably at most 3 micrometers, and most preferably at most 2 micrometers. For inorganic underlayers (e.g., metal or metal compound underlayer), the thickness of the underlayer is typically at least 0.005 micrometer, preferably at least 0.01 micrometer, and more preferably at least 0.02 micrometer. For inorganic underlayers, the thickness of the underlayer is typically at most 10 micrometers, preferably at most 4 micrometers, and more preferably at most 2 micrometers.

Optionally, the thermal transfer donor element further includes an interlayer on at least a portion of the light-to-heat conversion layer as described, for example, in U.S. Pat. No. 5,725,989 (Chang et al.) and U.S. Patent Application Publication No. 2005/0287315 (Kreilich et al.). The optional interlayer may be used to minimize damage and contamination of the transferred portion of the transfer layer and may also reduce distortion in the transferred portion of the transfer layer. The interlayer may also influence the adhesion of the transfer layer to the thermal transfer element or otherwise control the release of the transfer layer in the imaged and non-imaged regions. Preferably, the interlayer has high thermal resistance and does not distort or chemically decompose under the imaging conditions, particularly to an extent that renders the transferred image non-functional. Preferably, the interlayer remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g, silica, titania, and other metal oxides)), organic/inorganic composite layers, and combinations thereof. Organic materials suitable as interlayer materials include both thermoset and thermoplastic materials.

Suitable materials for inclusion in thermoset interlayers include those materials which may be crosslinked by thermal, radiation, and/or chemical treatment including, but not limited to, polymerizable and/or crosslinkable monomers, oligomers, prepolymers, and/or polymers that may be used as binders and crosslinked to form the desired heat-resistant, reflective interlayer after the coating process. The monomers, oligomers, prepolymers, and/or polymers that are suitable for this application include known chemicals that can form a crosslinked heat and/or solvent resistant polymeric layer to form interlayers including crosslinked polyacrylates, polymethacrylates, polyesters, epoxies, polyurethanes, (meth) acrylate copolymers, methacrylate copolymers, and combinations thereof For ease of application, the thermoset materials are usually coated onto the light-to-heat conversion layer as thermoplastic precursors and subsequently crosslinked to form the desired crosslinked interlayer. Suitable thermoplastic materials include, for example, polyacrylates, polymethacrylates, polystyrenes, polyurethanes, polysulfones, polyesters, polyimides, and combinations thereof. These thermoplastic organic materials may be applied via conventional coating techniques (e.g., solvent coating or spray coating). Typically, the glass transition temperature ($T_g$) of thermoplastic materials suitable for use in the interlayer is 25° C. or greater, more preferably 50° C. or greater, more preferably 100° C. or greater, and more preferably 150° C. or greater.

The interlayer may be optically transmissive, optically absorbing, optically reflective, or some combination thereof, at the imaging radiation wavelength.

Inorganic materials suitable as interlayer materials include, for example, metals, metal oxides, metal sulfides, inorganic carbon coatings, and combinations thereof. In one embodiment the inorganic interlayer is highly transmissive at the imaging light wavelength. In another embodiment the inorganic interlayer is highly reflective at the imaging light wavelength. These materials may be applied to the light-to-heat-conversion layer via conventional techniques (e.g., vacuum sputtering, vacuum evaporation, and/or plasma jet deposition).

The interlayer may provide a number of benefits. The interlayer may be a barrier against the transfer of material from the LTHC layer. It may also modulate the temperature attained in the transfer layer so that thermally unstable and/or temperature sensitive materials can be transferred. For example, the interlayer can act as a thermal diffuser to control the temperature at the interface between the interlayer and the transfer layer relative to the temperature attained in the LTHC layer, which may improve the quality (i.e., surface roughness, edge roughness, etc.) of the transferred layer. The presence of an interlayer may also result in improved plastic memory or decreased distortion in the transferred material. The interlayer may also influence the adhesion of the transfer layer to the rest of the thermal transfer donor element, thus providing additional variable that may be adjusted to optimize the LITI donor/receptor system transfer properties. In the case where imaging is performed via irradiation from the donor side, a reflective interlayer may attenuate the level of imaging radiation transmitted through the interlayer and thereby reduce any transferred image damage that may result from interaction of the transmitted radiation with the transfer layer or the receptor, which can be particularly beneficial in reducing thermal damage that may occur to the transferred image when the receptor is highly absorptive of the imaging radiation. However, in some cases, an interlayer may not be needed or desired, and the transfer layer can be coated directly onto the LTHC. The interlayer may contain additives, including, for example, photoinitiators, surfactants, pigments, plasticizers, coating aids, and combinations thereof. The thickness and optical properties (e.g., absorption, reflection, transmission) of the interlayer may depend on factors such as, for example, the material of the interlayer, the thickness, imaging radiation-absorption properties, the material of the LTHC layer, the material of the transfer layer, the wavelength of the imaging radiation, the duration of exposure of the thermal transfer element to imaging radiation, and combinations thereof. For polymer interlayers, the thickness of the interlayer is typically at least 0.05 micrometer, preferably at least 0.1 micrometer, more preferably at least 0.5 micrometer, and most preferably at least 0.8 micrometer. For polymer interlayers, the thickness of the interlayer is typically at most 10 micrometers, preferably at most 4 micrometers, more preferably at most 3 micrometers, and most preferably at most 2 micrometers. For inorganic interlayers (e.g., metal or metal compound interlayers), the thickness of the interlayer is typically at least 0.005 micrometer, preferably at least 0.01 micrometer, and more preferably at least 0.02 micrometer. For inorganic interlayers, the thickness of the interlayer is typically at most 10 micrometers, preferably at most 3 micrometers, and more preferably at most 1 micrometer.

In some embodiments, the thermal transfer donor element further includes a thermal transfer layer on at least a portion of the light-to-heat conversion layer or the interlayer as disclosed, for example, in U.S. Pat. No. 6,582,876 (Wolk et al.) and U.S. Pat. No. 6,866,979 (Chang et al.).

The transfer layer can be formulated to be appropriate for the corresponding imaging application (e.g., color proofing, printing plate, and color filters). The transfer layer may itself include thermoplastic and/or thermoset materials. In many product applications (for example, in printing plate and color filter applications) the transfer layer materials are preferably crosslinked after laser transfer in order to improve performance of the imaged article. Additives included in the transfer layer will again be specific to the end-use application (e.g., colorants for color proofing and color filter applications, photoinitiators for photo-crosslinked and/or photo-crosslinkable transfer layers) and are well known to those skilled in the art.

Because the interlayer can modulate the temperature profile in the thermal transfer layer, materials which tend to be more sensitive to heat than typical pigments may be transferred with reduced damage using the process of the present invention. For example, medical diagnostic chemistry can be included in a binder and transferred to a medical test card using the present invention with less likelihood of damage to the medical chemistry and/or less possibility of corruption of the test results. A chemical or enzymatic indicator would be less likely to be damaged using the present invention with an interlayer compared to the same material transferred from a conventional thermal donor element.

The thermal transfer layer may include classes of materials including, but not limited to dyes (e.g., visible dyes, ultraviolet dyes, fluorescent dyes, radiation-polarizing dyes, IR dyes, and combinations thereof), optically active materials, pigments (e.g., transparent pigments, colored pigments, and/or black body absorbers), magnetic particles, electrically conducting or insulating particles, liquid crystal materials, hydrophilic or hydrophobic materials, initiators, sensitizers, phosphors, polymeric binders, enzymes, and combinations thereof.

For many applications such as color proofing and color filter elements, the thermal transfer layer will include colorants. Preferably the thermal transfer layer will include at least one organic or inorganic colorant (i.e., pigments or dyes) and a thermoplastic binder. Other additives may also be included such as an IR absorber, dispersing agents, surfactants, stabilizers, plasticizers, crosslinking agents, coating aids, and combinations thereof. Any pigment may be used, but for applications such as color filter elements, preferred pigments are those listed as having good color permanency and transparency in the *NPIRI Raw Materials Data Handbook*, Volume 4 (Pigments) or Herbst, *Industrial Organic Pigments*, VCH (1993). Either non-aqueous or aqueous pigment dispersions may be used. The pigments are generally introduced into the color formulation in the form of a millbase including the pigment dispersed with a binder and suspended into a solvent or mixture of solvents. The pigment type and color can be chosen such that the color coating is matched to a preset color target or specification set by the industry. The type of dispersing resin and the pigment-to-resin ratio will depend upon the pigment type, surface treatment on the pigment, dispersing solvent and milling process used in generating the millbase, or combinations thereof. Suitable dispersing resins include vinyl chloride/vinyl acetate copolymers, poly(vinyl acetate)/crotonic acid copolymers, polyurethanes, styrene maleic anhydride half ester resins, (meth)acrylate polymers and copolymers, poly(vinyl acetals), poly(vinyl acetals) modified with anhydrides and amines, hydroxy alkyl cellulose resins, styrene acrylic resins, and combinations thereof. A preferred color transfer coating composition includes 30-80% by weight pigment, 15-60% by weight resin, and 0-20% by weight dispersing agents and additives.

One example of a transfer layer includes a single or multicomponent transfer unit that is used to form at least part of a multilayer device, such as an organic electroluminescent (OEL) device, or another device used in connection with OEL devices, on a receptor. In some cases, the transfer layer may include all of the layers needed to form an operative device. In other cases, the transfer layer may include fewer than all the layers needed to form an operative device, the other layers being formed via transfer from one or more other donor elements or via some other suitable transfer or patterning method. In still other instances, one or more layers of a device may be provided on the receptor, the remaining layer or layers being included in the transfer layer of one or more donor elements. Alternatively, one or more additional layers of a device may be transferred onto the receptor after the transfer layer has been patterned. In some instances, the transfer layer is used to form only a single layer of a device.

In one embodiment, an exemplary transfer layer includes a multicomponent transfer unit that is capable of forming at least two layers of a multilayer device. These two layers of the multilayer device often correspond to two layers of the transfer layer. In this example, one of the layers that is formed by transfer of the multicomponent transfer unit can be an active layer (i.e., a layer that acts as a conducting, semiconducting, electron blocking, hole blocking, light producing (e.g., luminescing, light emitting, fluorescing, and/or phosphorescing), electron producing, and/or hole producing layer). A second layer that is formed by transfer of the multicomponent transfer unit can be another active layer or an operational layer (i.e., a layer that acts as an insulating, conducting, semiconducting, electron blocking, hole blocking, light producing, electron producing, hole producing, light absorbing, reflecting, diffracting, phase retarding, scattering, dispersing, and/or diffusing layer in the device). The second layer can also be a non-operational layer (i.e., a layer that does not perform a function in the operation of the device, but is provided, for example, to facilitate transfer and/or adherence of the transfer unit to the receptor substrate during patterning). The multicomponent transfer unit may also be used to form additional active layers, operational layers, and/or non-operational layers In another aspect, the present invention provides a method of preparing a substrate film for a thermal transfer donor element. The method includes: forming a stack of layers including at least two dyads, wherein each dyad includes: an absorbing first layer; and an essentially non-absorbing second layer, wherein each absorbing first layer of the at least two dyads has essentially the same optical absorption rate.

In another aspect, the present invention provides methods of preparing thermal transfer donor elements, and methods for selective thermal mass transfer using such donor elements. In certain embodiments, the method includes: providing an essentially non-absorbing substrate; and forming a stack of layers including at least two dyads on at least a portion of the substrate, wherein each of the at least two dyads includes: an absorbing first layer; and an essentially non-absorbing second layer, wherein each absorbing first layer of the at least two dyads has essentially the same optical absorption rate.

A wide variety of methods can be used for forming LTHC layers that include a stack of layers including at least two dyads. Exemplary methods include (i) sequentially coating layers that have absorber material dispersed in a crosslinkable binder and layers of crosslinkable binder without added absorber material, and either crosslinking after each coating step or crosslinking multiple layers together after coating all the pertinent layers; (ii) sequentially vapor depositing absorbing layers and layers that are essentially non-absorbing; (iii) sequentially forming layers including an absorber material disposed in a crosslinkable binder and essentially non-absorbing vapor deposited layers, where the crosslinkable binder may be crosslinked immediately after coating that particular layer or after other coating steps are performed; (iv) sequentially forming layers including a crosslinkable binder without added absorber material and absorbing vapor deposited layers, where the crosslinkable binder may be crosslinked immediately after coating that particular layer or after other coating steps are performed; (v) sequentially extruding layers having an absorber material disposed in a binder and layers of binder without added absorber material; (vi) extruding a stack of dyads, with each dyad including an absorbing layer and an essentially non-absorbing layer; and (vii) any suitable combination or permutation of the above. Such methods known in the art include, for example, multilayer extrusion methods as described, for example, in U.S. Pat. No. 5,882,774 (Jonza et al.), U.S. Pat. No. 6,352,761 (Hebrink et al.), U.S. Pat. No. 6,368,699 (Gilbert et al.), U.S. Pat. No. 6,569,515 (Hebrink et al.), U.S. Pat. No. 6,673,425 (Hebrink et al.), U.S. Pat. No. 6,783,349 (Neavin et al.), U.S. Pat. No. 6,946,188 (Hebrink et al.), and U.S. Patent Application Publication No. 2004/0214031 A1 (Wimberger-Friedl et al.). Additional such methods known in the art include, for example, multilayer coating-deposition methods as described, for example, in U.S. Pat. No. 5,440,446 (Shaw et al.), U.S. Pat. No. 5,725,909 (Shaw et al.), and U.S. Pat. No. 6,231,939 (Shaw et al.).

Optionally, the layers can be oriented either during or after the formation thereof as described, for example, in U.S. Pat. No. 6,045,737 (Harvey et al.). For example, orienting polyester films can influence the material morphology (e.g., increased crystallinity). Additionally, orienting (e.g., tentering) can result in anisotropic properties including, for example, anisotropic thermal conductivity, which can influence the fidelity of the transferred material in a thermal transfer process. Orientation at temperatures below the melting point of the polymer (i.e., approximately 260° C. for certain polyesters) can also influence a variety of other properties including, for example, thermal expansion, thermal shrinkage, and physical properties (e.g., modulus and elasticity).

In some embodiments the method includes extruding the first layer and the second layer of at least one dyad (e.g., coextruding the first layer and the second layer, preferably simultaneously). In certain embodiments, each layer of the at least two dyads is simultaneously extruded onto a substrate. In certain embodiments, each of the layers is coextruded (e.g., simultaneously coextruded) with a substrate. Such extrusion methods include multilayer extrusion as described herein.

In certain other embodiments, the present invention provides methods of preparing thermal transfer donor elements including: providing an essentially non-absorbing substrate; forming an absorbing first layer on at least a portion of the substrate; and forming an essentially non-absorbing second layer on at least a portion of the absorbing first layer, wherein the composition of the essentially non-absorbing substrate is essentially the same as the composition of the essentially non-absorbing second layer. The methods optionally further include forming a thermal transfer layer. In certain embodiment, forming the first and/or second layer includes extruding the first and/or second layers (e.g., coextruding the first layer and the second layer, preferably simultaneously). In certain embodiments, each layer of the at least two dyads is simultaneously extruded onto the substrate.

The above-described method can be used to prepare a monolithic donor (i.e., a donor that appears to be a single layer). For example, the monolithic donor can be described as a support film having an integral LTHC layer and an interlayer, each based on the same thermoplastic resin. For another example, the monolithic donor can be described as a single, monolithic thermoplastic film with a doped or filled laser absorbing region. Monolithic donors can have a wide variety of advantages over donors known in the art that include multiple, distinct layers. For example, the structural integrity of a multilayer donor based on three thermally fused layers of identical thermoplastic is expected to be superior to that of solution coated constructions. Further, monolithic donors prepared by methods described herein can have a reduced level of extraneous compounds (e.g., dispersants, surfactants, wetting agents, solvents, and/or monomers), which can result in reduction or elimination of outgassing commonly encountered for donors prepared by conventional methods. Additionally, monolithic donors prepared by methods described herein can be prepared without acrylates, which are known to be excited state quenching species that are detrimental in the OLED patterning process. Further, the efficiency of such methods can be increased, because two solution coatings and multiple rewinds, inspections, and/or cleanings can be eliminated. Finally, the method can be compatible with the application of protective liners (e.g., polypropylene liners), hiding the critical clean interfaces until they are exposed in an ultraclean display manufacturing environment.

Coextrusion methods allow for substantially broader binder vehicle material options. For example, polyethylene terephthalate (PET) pellets loaded with a dye or pigment (e.g., carbon black and/or Copper Phthalocyanine) that absorbs substantial quantities of light from 808 to 1064 nanometers can be readily obtained. Such pellets can be utilized for extruding the LTHC layer, while a non-pigmented pellet of the same grade of polyester could be used for extruding a base layer and/or interlayers. The ability to select binder vehicle materials from substantially broader options can result in a wide variety of advantages, including, for example, improved thermal stability, improved molecular weight distribution, improved solvent resistance, reduction or elimination of low molecular weight additives and/or by-products (e.g. flow agents, dispersants, photo-initiators, and/or unreacted monomer), reduction of elimination of retained solvent, and elimination of primer layers and/or tie layers needed for adhesion to a base film.

Additionally, while PET is an attractive option for coextrusion, many other extrudable polymers are also available which can provide important benefits to the donors. Additional polymer choices include, for example, acrylics, urethanes, polyethylene naphthalate, co-polyesters, polyamides, polyimides, polysulfones, polyethylene, polypropylene, rubber, polystyrene, silicones, fluoropolymers, phenolics, and/or epoxies. One can select a polymer or a polymer blend based on a variety of factors, including, for example, refractive index, Tg, melt point, molecular weight distribution, dimensional stability, flexibility, rigidity, and/or birefringence.

Methods including coextrusion can result in potential improvements in process efficiency including, for example, the elimination of primer layers and/or tie layers, elimination of multiple passes through coaters, elimination of drying steps, elimination of UV curing steps, elimination of yield losses associated with solution coatings, and/or additional material handling losses. In addition, product parameters can often be readily adjusted in methods including coextrusion. For example, the thickness of each portion of the monolithic donor can be significantly varied in the coextrusion process. Conventional down stream web processing such as length orientation, tentering, heat setting, and/or crystallization zones can also be used in conjunction with coextrusion to impart desired characteristics (e.g., anisotropic thermal conductivity) to the donor. Further, surface modification techniques such as flash lamp, calendaring, and/or flame embossing can be used in conjunction with coextrusion to provide advantageous alterations of surface roughness, morphology, and/or additional desired characteristics.

In a further aspect, the present invention provides a method for selective thermal mass transfer using the thermal transfer donor elements as described herein. Exemplary methods include: providing a thermal transfer donor element as described herein; placing the thermal transfer layer of the donor element adjacent to a receptor substrate; and thermally transferring portions of the thermal transfer layer from the donor element to the receptor substrate by selectively irradiating the donor element with imaging radiation that can be absorbed and converted into heat by the light-to-heat conversion layer. Thermal transfer methods are well known in the art as described, for example, in U.S. Pat. No. 7,014,978 (Bellman et al.).

For example, in methods of the present invention, emissive organic materials, including light emitting polymers (LEPs) or other materials, can be selectively transferred from the transfer layer of a donor sheet to a receptor substrate by placing the transfer layer of the donor element adjacent to the receptor and selectively heating the donor element. Illustratively, the donor element can be selectively heated by irradiating the donor element with imaging radiation that can be absorbed by light-to-heat converter material disposed in the donor, often in a separate LTHC layer, and converted into heat. In these cases, the donor can be exposed to imaging radiation through the donor substrate, through the receptor, or both. The radiation can include one or more wavelengths, including visible light, infrared radiation, or ultraviolet radiation, for example, from a laser, lamp, or other such radiation source. Other selective heating methods can also be used, such as using a thermal print head or using a thermal hot stamp (e.g., a patterned thermal hot stamp such as a heated silicone stamp that has a relief pattern that can be used to selectively heat a donor). Material from the thermal transfer layer can be selectively transferred to a receptor in this manner to imagewise form patterns of the transferred material on the receptor. In many instances, thermal transfer using light from, for example, a lamp or laser, to patternwise expose the donor can be advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the donor sheet, and/or the materials of the donor sheet. The transferred pattern can also be controlled by irradiating the donor element through a mask.

As mentioned, a thermal print head or other heating element (patterned or otherwise) can also be used to selectively heat the donor element directly, thereby pattern-wise transferring portions of the transfer layer. In such cases, the light-to-heat converter material in the donor sheet is optional. Thermal print heads or other heating elements may be particularly suited for making lower resolution patterns of material or for patterning elements whose placement need not be precisely controlled.

Transfer layers can also be transferred from donor sheets without selectively transferring the transfer layer. For example, a transfer layer can be formed on a donor substrate that, in essence, acts as a temporary liner that can be released after the transfer layer is contacted to a receptor substrate, typically with the application of heat or pressure. Such a method, referred to as lamination transfer, can be used to transfer the entire transfer layer, or a large portion thereof, to the receptor.

Certain embodiments of the present invention are illustrated as follows. It is to be understood that the particular examples, materials, amounts, and procedures are to be interpreted broadly in accordance with the scope and spirit of the invention as set forth herein.

Described herein are a variety of optical materials for use in forming LTHC layers for donor sheets used to pattern materials using a laser induced thermal imaging (LITI) process. For example, organic light-emitting device (OLED) materials can typically be patterned using an imaging wavelength of 808 nm and LTHC layers constructed of a polymeric matrix loaded with an absorbing material such as carbon black or blue pigment absorbers. These so called "dispersed particulate absorbers" have optical absorbance at the imaging wavelength that is significant compared with an ordinary polymer, for example a range of 0.5 to 2.0 micrometers$^{-1}$, and preferably 1.0 micrometer$^{-1}$, but small compared with optically absorbing inorganic materials that can be coated using vapor coating methods (e.g., Germanium with an absorbance of approximately 10 micrometers$^{-1}$ at 808 nm). A typical donor for use in patterning OLEDs includes a LTHC layer with a thickness of 2.7 micrometers and absorption of 1.0 micrometer$^{-1}$ (hereinafter "standard uniform LTHC layer"). Described herein are examples of donors using a series of highly absorbing thin layers that approximates the optical properties of donors based on dispersed particulate absorbers.

Disclosed herein is an example of using a LTHC layer having packets of dyads of two materials consisting of an absorbing material with constant absorption $a_0$ and an essentially non-absorbing material to approximate the optical response of a LTHC layer having an arbitrary, finite, non-uniform absorption profile $a_{NU}(x)$ versus depth x in the LTHC layer (subscript NU for non-uniform). Non-uniform absorption profiles are approximated via dyad thickness variations. To facilitate the comparisons, some physical quantities are described as follows.

Optical absorption rate is defined to be the rate of decay of optical power from a point $x_0$ to a point $x_1$ versus distance between the two points. The distance between these two points is distance x from a point at a depth x in the LTHC layer relative to the surface of incidence.

Fraction of power transmitted T versus depth x in a LTHC layer is the instantaneous optical power (magnitude of the Poynting vector) normalized to the value of the optical power at the incidence surface of the LTHC layer. Assuming that the absorption rate is a function of depth x only, the fraction of power transmitted can be written as $$T(x) = \exp\left\{-\int_0^x a(x')\,dx'\right\}.$$

The fraction total power absorbed F(x)up to point x is simply the power that is not transmitted or $$F(x)=1-T(x).$$

The profile of power density absorbed g(x) versus depth x is the instantaneous power density absorbed at a point x and is given by (minus the divergence of the Poynting vector)

$$g(x) = -\frac{dT(x)}{dx} = a(x)\exp\left\{-\int_0^x a(x')\,dx'\right\}.$$

To compare multilayer, graded LTHC layers that behave optically in a manner similar to typical uniform LTHC layers, it is convenient to consider plots of the second quantity (fraction of power transmitted T) and third quantity (fraction total power absorbed F(x)), with optically similar LTHC layers having similar T(x) and F(x) quantities.

Referring to FIG. 1, the plot compares the fraction of power absorbed and transmitted versus depth in a LTHC layer for a standard uniform LTHC layer (solid lines) and a single layer of Germanium (broken lines) having the same thickness (2.7 micrometers). Note that the fraction of transmitted light is reduced to 1/e times its initial value at 0.1 micrometers for Germanium versus 1 micrometer for the standard uniform LTHC layer.

Figure 2:
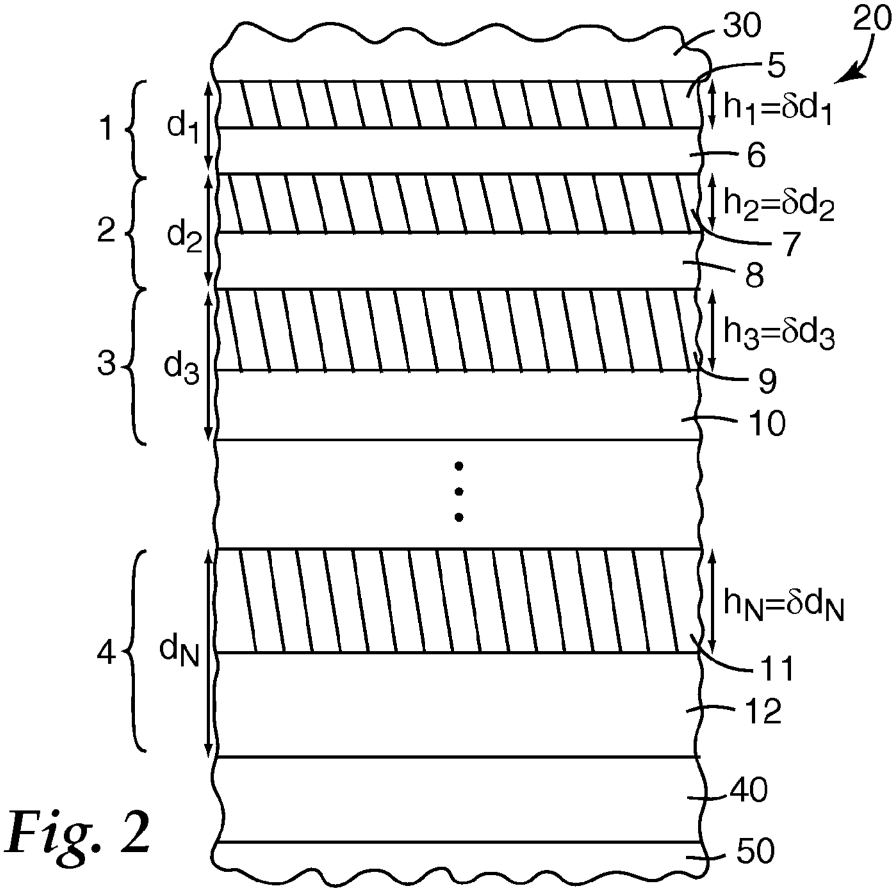
FIG. 2 is an illustration of an embodiment of a multilayer, graded LTHC layer including multiple dyads of absorbing layers and essentially non-absorbing layers.

A multilayer, graded LTHC layer prepared using dyads of Germanium and a non-absorbing material such as MgF are shown herein in theory to approximate the absorption profiles for a standard uniform LTHC layer. This can be accomplished using, for example, an embodiment for a LTHC layer with multiple dyads as illustrated, for example, in FIG. 2. In the case of this design, for each dyad the ratio of thickness of absorbing layer $h_i$ to total dyad thickness $d_i$ is set so that the total power absorbed by each dyad is the same as the power absorbed by a lamina of equal thickness of the standard LTHC layer. This is accomplished by setting $$\frac{h_1}{d_1} = \frac{a_{LTHC}}{a_{Ge}},$$

where $a_{LTHC}$ is the absorption rate of a standard uniform LTHC layer, and $a_{Ge}$ is the absorption rate of Germanium. In FIG. 2, the thickness of each dyad is allowed to change as needed.

Referring to FIG. 2, multilayer, graded LTHC layer 20 includes dyads 1, 2, 3, and 4. Dyads 1, 2, 3, and 4 each include an absorbing layer and an essentially non-absorbing layer. Typically, the stack of layers includes alternating absorbing layers and essentially non-absorbing layers. For example, layers 5, 7, 9, and 11 can be absorbing layers and layers 6, 8, 10, and 12 can be essentially non-absorbing layers. Alternatively, layers 5, 7, 9, and 11 can be essentially non-absorbing layers and layers 6, 8, 10, and 12 can be absorbing layers. FIG. 2 further illustrates optional substrate 30, optional interlayers and/or transfer layers 40, and optional receptor 50.

The thicknesses of dyads 1, 2, 3, 4 can be represented by $d_1$, $d_2$, $d_3$, and $d_N$, respectively. When layers, 5, 7, 9, and 11 represent absorbing layers, and layers 6, 8, 10, and 12 represent essentially non-absorbing layers, the fraction absorbing material (δ) for each dyad can be represented by the ratio of the thickness of the absorbing layer (represented by $h_1$, $h_2$, $h_3$, and $h_N$ for layers 5, 7, 9, and 11, respectively) divided by the thickness of the dyad. For the embodiment illustrated in FIG. 2, the fraction absorbing material (δ) for each dyad is essentially the same, and the overall dyad thicknesses ($d_1$, $d_2$, $d_3$, and $d_N$) are adjusted such that the total power absorbed by each dyad is essentially the same. Since the total dyad thicknesses must then increase as a function of depth in the LTHC layer, the average power density absorbed per dyad decreases as a function of depth in the LTHC layer and the peak temperature rise in the LTHC will thus to a first approximation decrease as a function of depth in the LTHC layer.

Constructions such as illustrated in FIG. 2 can be useful when it is desired to construct a material that has uniform average optical and thermal properties. In addition, it may be useful for the case where increased temperature rise is required near the laser entrance region of the LTHC layer to help generate one or more gas bubbles within the LTHC layer that have the effect of creating a pressure wave that helps to induce transfer. The multiple layers in the LTHC layer can be adjusted to increase or decrease the expected region or regions where the gas bubbles are formed and the multiple essentially non-absorbing regions can act as bubble skins that help prevent bursting of the bubble.

Figure 3:
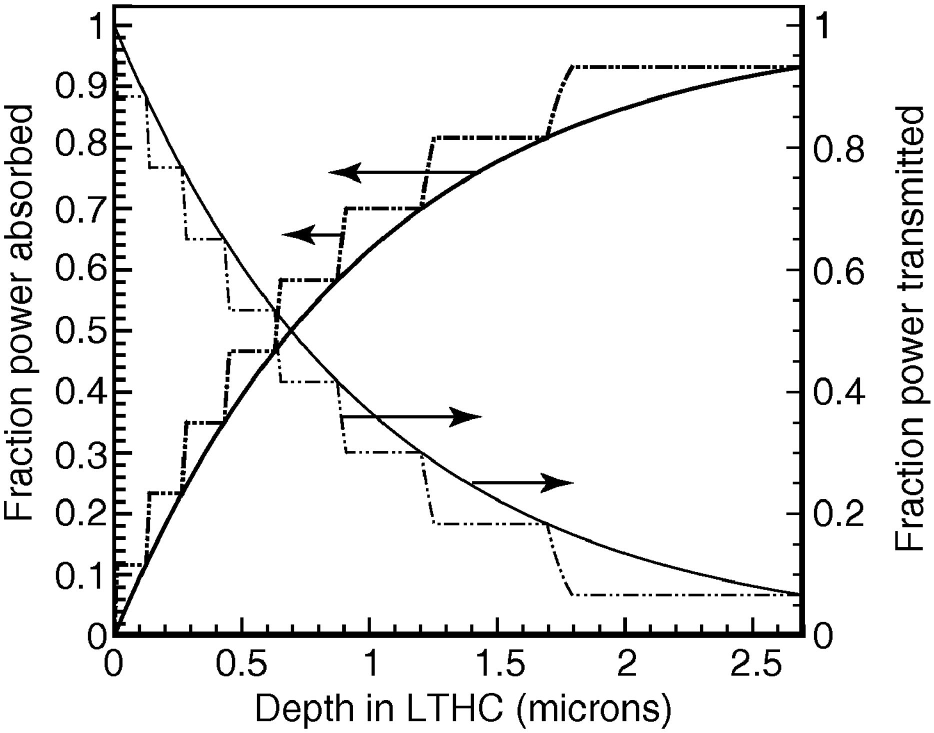
FIG. 3 is a plot comparing the fractions of power absorbed and transmitted for a standard uniform LTHC layer (solid lines) versus a multilayer, graded LTHC layer (broken lines) as illustrated in FIG. 2 with 8 dyads of Germanium-MgF.

FIG. 3 illustrates comparisons of the fractions of power absorbed and transmitted for a standard uniform LTHC layer (solid lines) versus a multilayer, graded LTHC layer (broken lines) as illustrated in FIG. 2 with 8 dyads of Germanium-MgF. The ratio of thickness of Germanium to MgF in each layer is 1:9 (Germanium layer is 0.1 the total thickness of each dyad). FIG. 3 illustrates that the multi-layer structure with 8 dyads closely approximates the profiles of power absorbed and transmitted versus depth in the LTHC layer for a standard uniform LTHC layer. In other words, the multi-layer structure with 8 dyads allows spread of the absorption of optical energy across the depth of the LTHC in such a way that approximates the absorption profile for the standard uniform LTHC layer. FIG. 3 is a sub-case of the example in FIG. 2, where the thickness of each dyad is required to be the same.

Figure 4:
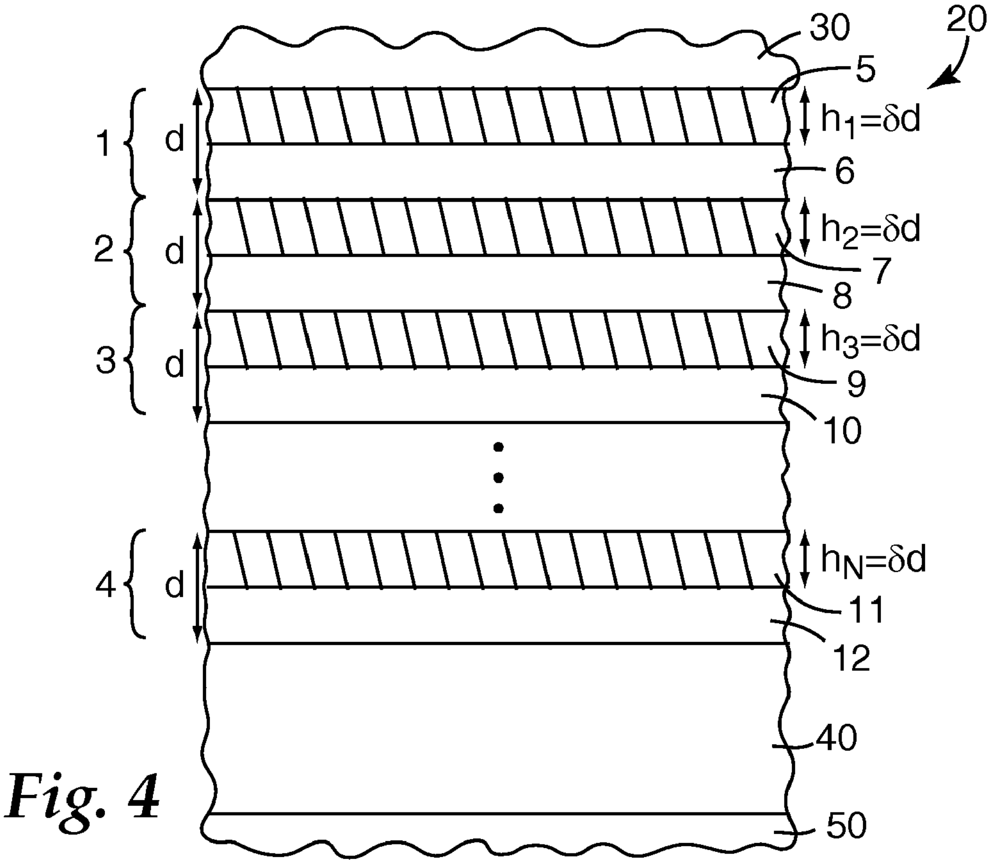
FIG. 4 is an illustration of another embodiment of a multilayer, graded LTHC layer including multiple dyads of absorbing layers and essentially non-absorbing layers.

FIG. 4 illustrates another example of a multilayer, graded LTHC layer similar to FIG. 2, except that the fraction of absorbing material (δ) is essentially the same for each dyad, and the dyad thickness (d) is essentially the same for each dyad. This has the effect of creating a composite LTHC layer with an average constant absorption rate per unit volume. This construction can be used, for example, to reduce the absorption rate per unit volume for multiple dyads of vacuum-coated materials such as aluminum (sub)oxide and indium-tin oxide where a single thick layer of aluminum (sub)oxide would have an absorption rate that is too large, and thus be susceptible to severe thermal defects. Constructions such as those illustrated in FIG. 4 can be useful to control the LTHC layer thickness and the average optical absorption per unit depth in the LTHC layer as described herein.

Figure 5:
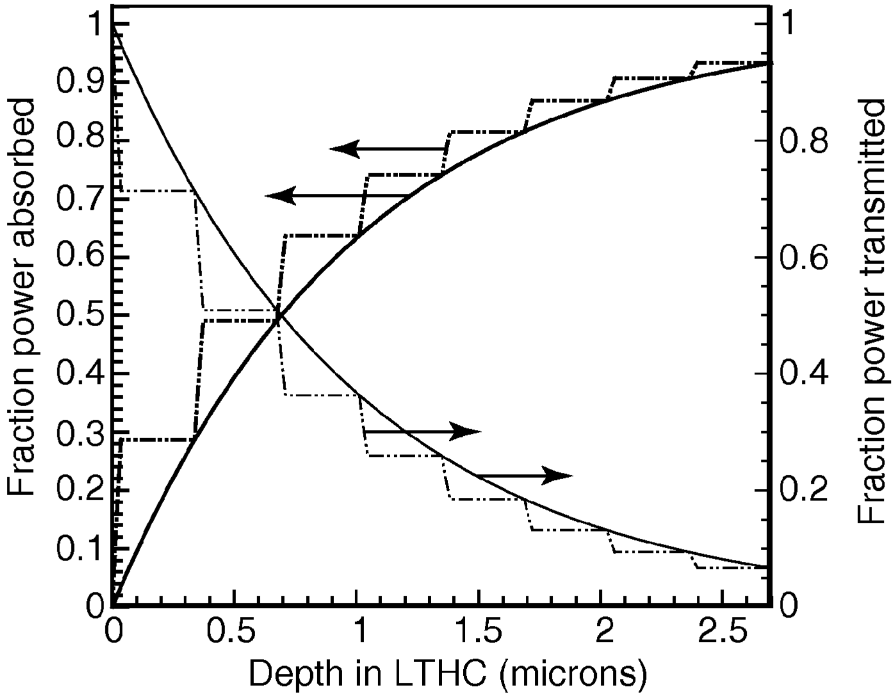
FIG. 5 illustrates comparisons of the fractions of power absorbed and transmitted for a standard uniform LTHC layer (solid lines) versus a multilayer, graded LTHC layer (broken lines) as illustrated in FIG. 4 with 8 dyads of Germanium-MgF.

FIG. 5 illustrates comparisons of the fractions of power absorbed and transmitted for a standard uniform LTHC layer (solid lines) versus a multilayer, graded LTHC layer (broken lines) as illustrated in FIG. 4 with 8 dyads of Germanium-MgF.

Figure 6:
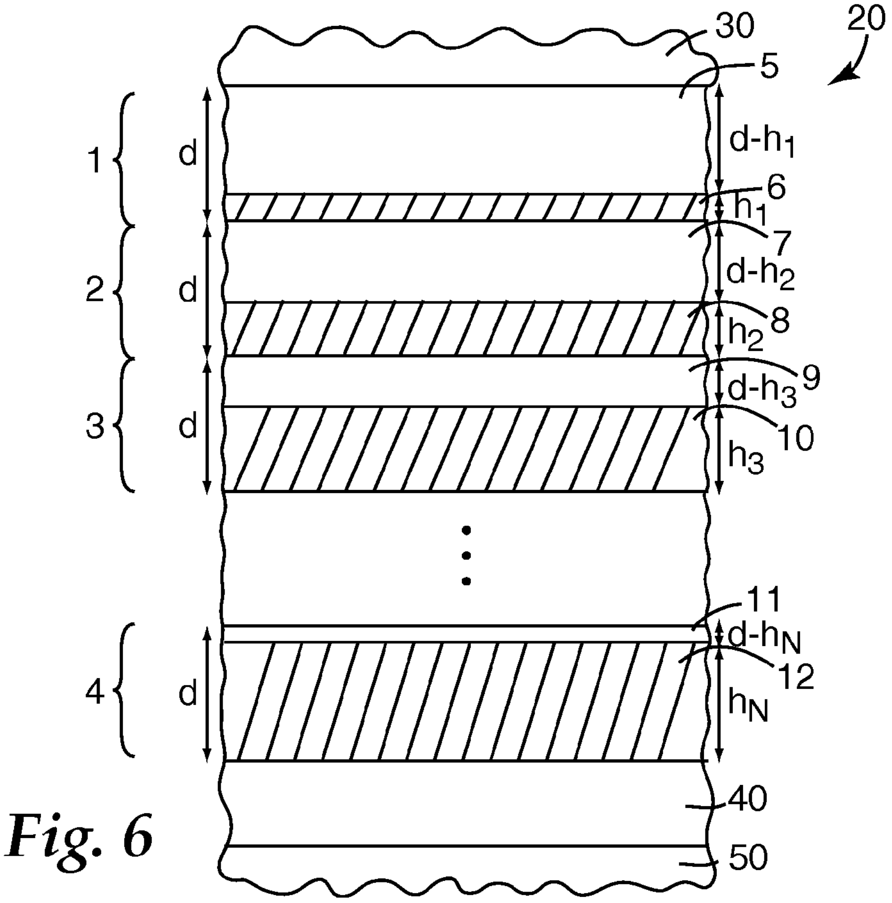
FIG. 6 is an illustration of another embodiment of a multilayer, graded LTHC layer including multiple dyads of absorbing layers and essentially non-absorbing layers.

Referring to FIG. 6, another example of a multilayer, graded LTHC layer similar to FIGS. 2 and 4, except that the stack of N dyads is arranged such that the thickness of each dyad (d) is essentially the same. Absorbing layers 6, 8, 10, and 12 have thicknesses ($h_1$, $h_2$, $h_3$, and $h_N$, respectively) that are allowed to change. The thicknesses of the absorbing layers are selected such that the total power absorbed by each dyad is essentially the same. Note that the ratio of thickness of the each absorbing layer ($h_{1 \ldots N}$) to each essentially non-absorbing layer ($d-h_{1 \ldots N}$) is not constant. Since the total power absorbed by each dyad is essentially the same and each dyad has essentially the same overall thickness, the total average power density absorbed is essentially the same for each dyad. To a first approximation, the average temperature rise of each dyad will thus be the same and the temperature rise of the LTHC layer will be approximately uniform across its thickness. In addition, the peak temperature of the LTHC layer can be adjusted by adjusting the dyad thickness.

A multilayer, graded LTHC layer as illustrated in FIG. 6 can be advantageous by allowing for minimization of the probability of the occurrence of thermally induced artifacts. By making the peak temperature as a function of depth in the LTHC layer as constant as possible versus depth, the peak temperature versus depth in the LTHC layer can be minimized. Because the probability of the occurrence of thermally induced artifacts has been correlated with peak temperature in the LTHC layer, minimizing the peak temperature as a function of depth in the LTHC layer can minimize the probability that these defects occur. Another advantage for multilayer, graded LTHC layers as illustrated in FIG. 6 is that adjustment of overall thickness of each dyad allows adjustment of the overall peak temperature of the LTHC layer, and thus the overall peak temperature reached by the donor material. This control scheme can be used to decrease the probability of thermal damage to the donor material.

Figure 7:
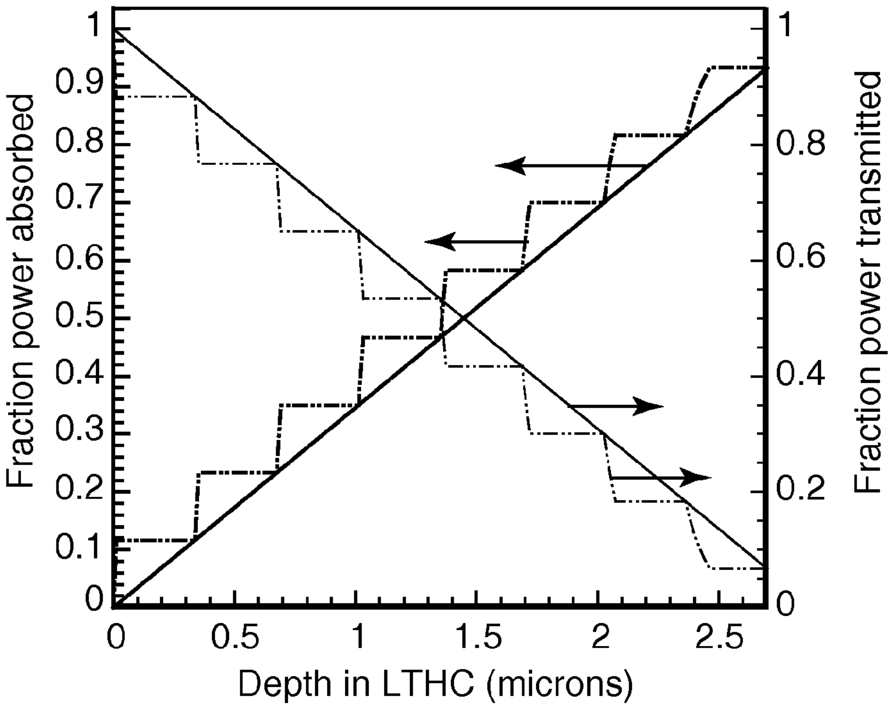
FIG. 7 is a plot comparing the fractions of power absorbed and transmitted for a target linear profile LTHC layer (solid lines) versus a multilayer, graded LTHC layer (broken lines) as illustrated in FIG. 6 with 8 dyads of Germanium-MgF.

FIG. 7 illustrates comparisons of the fractions of power absorbed and transmitted for a target linear profile LTHC layer (solid lines) versus a multilayer, graded LTHC layer (broken lines) as illustrated in FIG. 6 with 8 dyads of Germanium-MgF. FIG. 7 illustrates that an embodiment as illustrated in FIG. 6 with 8 dyads can approximate a linear profile of power absorbed and transmitted, which is not possible to accomplish using a single dyad or a single layer. The transmittance for the example illustrated in FIG. 7 has been adjusted to match that for the standard uniform LTHC layer.

Figure 8:
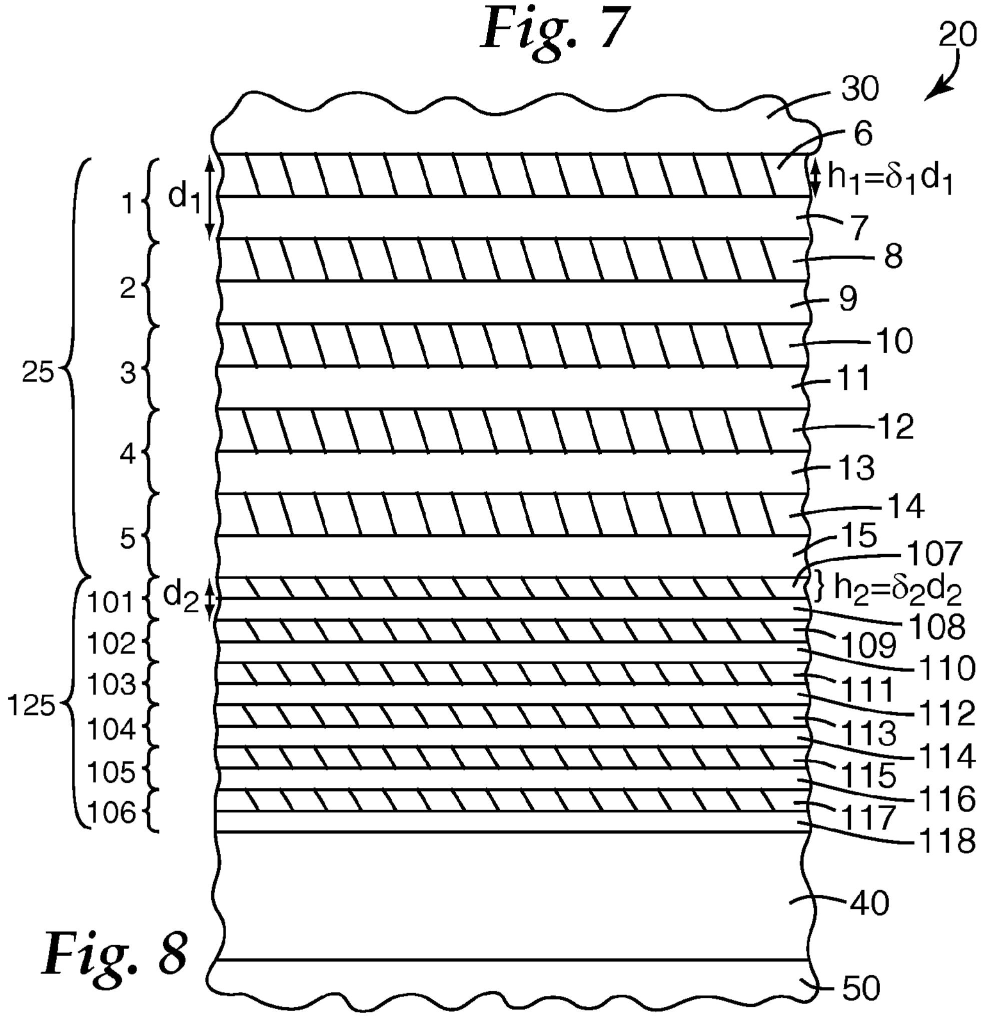
FIG. 8 is an illustration of an embodiment of a multilayer, graded LTHC layer including two bands of dyads. Each dyad includes an absorbing layer and an essentially non-absorbing layer.

Referring to FIG. 8, another example of a multilayer, graded LTHC layer 20 is illustrated that includes two bands of dyads, 25 and 125. Although not illustrated, the multilayer, graded LTHC layer can optionally include additional bands of dyads. Further, the number of dyads in each band is only for illustrative purposes, and each band of dyads can independently include more or less dyads than are illustrated in FIG. 8.

Referring to FIG. 8, band 25 includes dyads 1, 2, 3, 4, and 5. Dyads 1, 2, 3, 4, and 5 each include an absorbing layer and an essentially non-absorbing layer. Typically, the band of dyads includes alternating absorbing layers and essentially non-absorbing layers. For example, layers 6, 8, 10, 12, and 14 can be absorbing layers and layers 7, 9, 11, 13, and 15 can be essentially non-absorbing layers. Alternatively, layers 6, 8, 10, 12, and 14 be essentially non-absorbing layers and layers 7, 9, 11, 13, and 15 can be absorbing layers. The thicknesses of dyads 1, 2, 3, 4, and 5 can be represented by $d_1$. When layers 6, 8, 10, 12, and 14 represent absorbing layers, and layers 7, 9, 11, 13, and 15 represent essentially non-absorbing layers, the fraction absorbing material ($\delta_1$) for each dyad can be represented by the ratio of the thickness of the absorbing layer (represented by $h_1$) divided by the thickness of the dyad.

Again referring to FIG. 8, band 125 similarly includes dyads 101, 102, 103, 104, 105, and 106. Dyads 101, 102, 103, 104, 105, and 106 each include an absorbing layer and an essentially non-absorbing layer. Typically, the band of dyads includes alternating absorbing layers and essentially non-absorbing layers. For example, layers 107, 109, 111, 113, 115, and 117 can be absorbing layers and layers 108, 110, 112, 114, 116, and 118 can be essentially non-absorbing layers. Alternatively, layers 107, 109, 111, 113, 115, and 117 can be essentially non-absorbing layers and layers 108, 110, 112, 114, 116, and 118 can be absorbing layers. The thicknesses of dyads 101, 102, 103, 104, 105, and 106 can be represented by $d_2$. When layers 107, 109, 111, 113, 115, and 117 represent absorbing layers, and layers 108, 110, 112, 114, 116, and 118 represent essentially non-absorbing layers, the fraction absorbing material ($\delta_2$) for each dyad can be represented by the ratio of the thickness of the absorbing layer (represented by $h_2$) divided by the thickness of the dyad.

FIG. 8 further illustrates optional substrate 30, optional interlayers and/or transfer layers 40, and optional receptor 50.

For the embodiment illustrated in FIG. 8, the fraction absorbing material (δ) for each dyad is essentially the same, each dyad in band 25 has essentially the same thickness $d_1$, each dyad in band 125 has essentially the same thickness $d_2$, constant power is absorbed per band, and minimum peak power is absorbed per band. The construction illustrated in FIG. 8 combines a construction similar to that illustrated in FIG. 6, where it is possible to control the thickness and average optical absorption per unit depth within a single stack of dyads, with a stratified (e.g., dual layer) LTHC layer as described, for example, in U.S. Pat. Nos. 6,228,555, 6,468,715, and 6,689,538 (all to Hoffend Jr. et al.). Dual- or multi-band LTHC layers as illustrated in FIG. 8 can be formed from multiple thin layers of materials that would otherwise lead to thermally induced artifacts.

Figure 9:
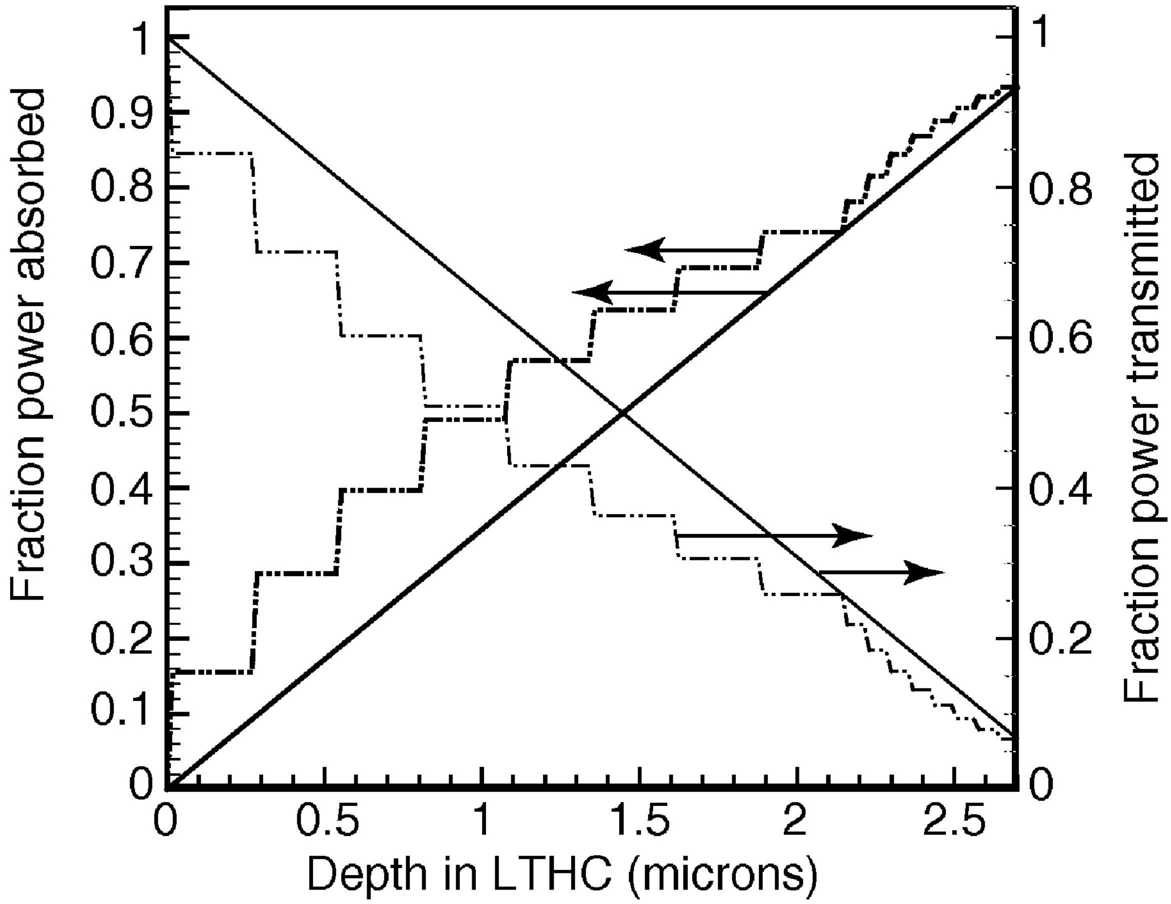
FIG. 9 is a plot comparing the fractions of power absorbed and transmitted for a targeted linear profile LTHC layer (solid lines) versus a multilayer, graded LTHC layer (broken lines) as illustrated in FIG. 8 with two bands, each including 8 dyads of Germanium-MgF.

FIG. 9 illustrates comparisons of the fractions of power absorbed and transmitted for a targeted linear profile LTHC layer (solid lines) versus a multilayer, graded LTHC layer (broken lines) as illustrated in FIG. 8 with two bands, each including 8 dyads of Germanium-MgF. In FIG. 9, each band was selected to have a constant absorption rate by using a construction similar to that illustrated in FIG. 4. The combination of absorption rates for the two bands was selected to approximate a linear profile.

The complete disclosure of all patents, patent applications, and publications, and electronically available material cited herein are incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A substrate film for a thermal transfer donor element comprising a stack of layers comprising at least two dyads, wherein each dyad comprises:

an absorbing first layer; and an essentially non-absorbing second layer, wherein each absorbing first layer of the at least two dyads has essentially the same optical absorption rate, wherein the fraction absorbing material for each dyad is essentially the same, and wherein the total thickness of each dyad is selected such that the total power absorbed by each dyad is essentially the same.

2. The substrate film of claim 1 wherein the at least two dyads form a stack having alternating absorbing layers and essentially non-absorbing layers.

3. The substrate film of claim 1 further comprising a skin layer on at least one surface of the film.

4. The substrate film of claim 1 further comprising a skin layer on both surfaces of the film.

5. A thermal transfer donor element comprising: an essentially non-absorbing substrate; and a light-to-heat conversion layer on at least a portion of the substrate, wherein the light-to-heat conversion layer comprises at least a first stack of layers comprising at least two dyads, wherein each of the at least two dyads of the first stack of layers comprises:

an absorbing first layer; and an essentially non-absorbing second layer, wherein each absorbing first layer of the at least two dyads has essentially the same optical absorption rate, wherein the fraction absorbing material for each dyad is essentially the same, and wherein the total thickness of each dyad is selected such that the total power absorbed by each dyad is essentially the same.

6. The thermal transfer donor element of claim 5 further comprising an underlayer disposed between the substrate and the light-to-heat conversion layer.

7. The thermal transfer donor element of claim 5 further comprising an interlayer on at least a portion of the light-to-heat conversion layer.

8. The thermal transfer donor element of claim 5 wherein the at least two dyads of the first stack of layers form a stack of layers having alternating absorbing layers and essentially non-absorbing layers.

9. A thermal transfer donor element comprising:

an essentially non-absorbing substrate; and a light-to-heat conversion layer on at least a portion of the substrate, wherein the light-to-heat conversion layer comprises at least a first stack of layers comprising at least two dyads, wherein each of the at least two dyads of the first stack of layers comprises:

an absorbing first layer; and an essentially non-absorbing second layer, wherein each absorbing first layer of the at least two dyads has essentially the same optical absorption rate, wherein the total thickness of each dyad in the first stack of layers is essentially the same, and wherein the thickness of the first layer and the thickness of the second layer for each dyad are selected such that the total power absorbed for each dyad in the first stack of layers is essentially the same.

10. A thermal transfer donor element comprising:

an essentially non-absorbing substrate; and a light-to-heat conversion layer on at least a portion of the substrate, wherein the light-to-heat conversion layer comprises:

a first stack of layers comprising at least two dyads, wherein each of the at least two dyads of the first stack of layers comprises:

an absorbing first layer; and an essentially non-absorbing second layer, wherein each absorbing first layer of the at least two dyads has essentially the same optical absorption rate, wherein the fraction of absorbing material is essentially the same for each dyad in the first stack of layers, and wherein the total thickness of each dyad in the first stack of layers is essentially the same; and a second stack of layers comprising at least two dyads; wherein each of the at least two dyads of the second stack of layers comprises:

an absorbing first layer; and an essentially non-absorbing second layer;

wherein each absorbing first layer of the at least two dyads has essentially the same optical absorption rate, wherein the fraction of absorbing material is essentially the same for each dyad in the second stack of layers, wherein the total thickness of each dyad in the second stack of layers is essentially the same, and wherein the total thickness of each dyad in the first stack of layers and the total thickness of each dyad in the second stack of layers are selected such that the peak power absorbed is minimized.

11. A method of preparing a substrate film for a thermal transfer donor element according to claim 1, the method comprising:

forming a stack of layers comprising at least two dyads, wherein each dyad comprises:

an absorbing first layer; and an essentially non-absorbing second layer, wherein each absorbing first layer of the at least two dyads has essentially the same optical absorption rate, wherein the fraction absorbing material for each dyad is essentially the same, and wherein the total thickness of each dyad is selected such that the total power absorbed by each dyad is essentially the same.

12. The method of claim 11 wherein forming the stack of layers comprises coextruding the at least two dyads and a base layer.

13. A method of preparing a thermal transfer donor element according to claim 5, the method comprising:

providing an essentially non-absorbing substrate; and forming a stack of layers comprising at least two dyads on at least a portion of the substrate, wherein each of the at least two dyads comprises:

an absorbing first layer; and an essentially non-absorbing second layer, wherein each absorbing first layer of the at least two dyads has essentially the same optical absorption rate, wherein the fraction absorbing material for each dyad is essentially the same, and wherein the total thickness of each dyad is selected such that the total power absorbed by each dyad is essentially the same.

14. The method of claim 13 wherein forming comprises extruding the first layer and the second layer of at least one dyad.

15. The method of claim 14 wherein extruding comprises coextruding the first layer and the second layer of the at least one dyad.

16. The method of claim 13 wherein forming comprises coextruding each layer of the at least two dyads onto the substrate.

17. A method of preparing a thermal transfer donor element, the method comprising:

providing an essentially non-absorbing substrate;

forming an absorbing first layer on at least a portion of the substrate; and forming an essentially non-absorbing second layer on at least a portion of the absorbing first layer, and forming a thermal transfer layer on at least a portion of the second layer, wherein the composition of the essentially non-absorbing substrate is essentially the same as the composition of the essentially non-absorbing second layer, and wherein forming the first and second layers comprises sequentially coating the layers.

18. A substrate film for a thermal transfer donor element comprising a stack of layers comprising at least two dyads, wherein each dyad comprises:

an absorbing first layer; and an essentially non-absorbing second layer, wherein each absorbing first layer of the at least two dyads has essentially the same optical absorption rate, wherein the total thickness of each dyad in the first stack of layers is essentially the same, and wherein the thickness of the first layer and the thickness of the second layer for each dyad are selected such that the total power absorbed for each dyad in the first stack of layers is essentially the same.

19. A method of preparing a substrate film for a thermal transfer donor element according to claim 18, the method comprising:

forming a stack of layers comprising at least two dyads, wherein each dyad comprises:

an absorbing first layer; and an essentially non-absorbing second layer, wherein each absorbing first layer of the at least two dyads has essentially the same optical absorption rate, wherein the total thickness of each dyad in the first stack of layers is essentially the same, and wherein the thickness of the first layer and the thickness of the second layer for each dyad are selected such that the total power absorbed for each dyad in the first stack of layers is essentially the same.

20. A method of preparing a thermal transfer donor element according to claim 9, the method comprising:

providing an essentially non-absorbing substrate; and forming a stack of layers comprising at least two dyads on at least a portion of the substrate, wherein each of the at least two dyads comprises:

an absorbing first layer; and an essentially non-absorbing second layer, wherein each absorbing first layer of the at least two dyads has essentially the same optical absorption rate, wherein the total thickness of each dyad in the first stack of layers is essentially the same, and wherein the thickness of the first layer and the thickness of the second layer for each dyad are selected such that the total power absorbed for each dyad in the first stack of layers is essentially the same.

* * * * *